United States Patent
Doi et al.

(10) Patent No.: US 12,316,209 B2
(45) Date of Patent: May 27, 2025

(54) METHOD AND SYSTEM FOR DIAGNOSING ABNORMALITY OF POWER DEVICE DRIVE IN INVERTER DEVICE

(71) Applicant: Hitachi Astemo, Ltd., Hitachinaka (JP)

(72) Inventors: Masahiro Doi, Hitachinaka (JP); Takeo Yamashita, Hitachinaka (JP); Mitsuhiro Iwasaki, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 226 days.

(21) Appl. No.: 18/010,097

(22) PCT Filed: Feb. 5, 2021

(86) PCT No.: PCT/JP2021/004273
§ 371 (c)(1),
(2) Date: Dec. 13, 2022

(87) PCT Pub. No.: WO2021/255989
PCT Pub. Date: Dec. 23, 2021

(65) Prior Publication Data
US 2023/0268822 A1 Aug. 24, 2023

(30) Foreign Application Priority Data
Jun. 15, 2020 (JP) .................. 2020-103248

(51) Int. Cl.
*H02M 1/08* (2006.01)
*B60L 3/00* (2019.01)
(Continued)

(52) U.S. Cl.
CPC ............... *H02M 1/08* (2013.01); *B60L 3/003* (2013.01); *B60L 15/007* (2013.01);
(Continued)

(58) Field of Classification Search
CPC ............... H03K 17/168; H03K 17/567; H03K 2217/0027; H03K 2217/0063; H03K 17/18; H02M 1/08–088
See application file for complete search history.

(56) References Cited

U.S. PATENT DOCUMENTS

2002/0089321 A1 7/2002 Matsuda
2006/0044726 A1* 3/2006 Sakata ................. H02H 7/0838
361/100
(Continued)

FOREIGN PATENT DOCUMENTS

DE 10200332 A1 7/2002
EP 3 041 120 A1 7/2016
(Continued)

OTHER PUBLICATIONS

Naoki Sakurai "Gate driver integrated circuit for high-current and high-speed insulated-gate bipolar transistors used in hybrid electric vehicle and electric vehicle inverters" Published 2017 (Year: 2017).*
(Continued)

*Primary Examiner* — Sisay G Tiku
(74) *Attorney, Agent, or Firm* — Foley & Lardner LLP

(57) ABSTRACT

Provided is an inverter device that detects abnormalities of a power device of the inverter device, and of a gate drive to be able to safely control the inverter device. The inverter device includes a gate voltage detection unit 19 that detects a gate voltage of the power device, and a drain voltage detection unit 30 that detects a drain voltage. A microcontroller 10 compares a gate drive signal 40 with a gate voltage detection signal 41 to make a diagnosis and compares the gate drive signal 40 with a drain voltage detection signal 42 to make a diagnosis, thereby making a diagnosis and detection of the gate voltage on normal. In addition, by generating a gate drive signal to the power device, from a gate voltage (Continued)

detection signal from a counter power device, a dead time is reduced.

4 Claims, 9 Drawing Sheets

(51) Int. Cl.
    *B60L 15/00*           (2006.01)
    *H02H 7/122*         (2006.01)
    *H03K 17/16*          (2006.01)
    *H03K 17/18*          (2006.01)
    *H03K 17/567*        (2006.01)

(52) U.S. Cl.
    CPC ......... *H02H 7/1227* (2013.01); *H03K 17/168* (2013.01); *H03K 17/567* (2013.01); *H03K 2217/0027* (2013.01); *H03K 2217/0063* (2013.01)

(56) References Cited

U.S. PATENT DOCUMENTS

| | | | | |
|---|---|---|---|---|
| 2014/0092655 A1* | 4/2014 | Igarashi | ................. | B60L 3/003 363/56.05 |
| 2017/0294911 A1* | 10/2017 | Zhao | .................... | H03K 17/127 |
| 2018/0269804 A1* | 9/2018 | Mizukami | ............... | H02M 1/32 |
| 2018/0331616 A1* | 11/2018 | Hirakata | .............. | H03K 17/687 |
| 2020/0067502 A1* | 2/2020 | Hiyama | ................ | H03K 17/163 |
| 2021/0050799 A1* | 2/2021 | Ogura | ..................... | H02M 1/32 |
| 2023/0101061 A1* | 3/2023 | Fabbro | ................ | H03K 17/689 361/115 |
| 2024/0128966 A1* | 4/2024 | Sakai | ................. | H03K 17/0828 |

FOREIGN PATENT DOCUMENTS

| | | | | |
|---|---|---|---|---|
| JP | 2007049870 A | * | 2/2007 | |
| JP | 2012135145 A | * | 7/2012 | |
| JP | 2013-247734 A | | 12/2013 | |
| JP | 2015201980 A | * | 11/2015 | |
| JP | 2017-50804 A | | 3/2017 | |
| JP | 2017050804 A | * | 3/2017 | |
| JP | 2017212583 A | * | 11/2017 | |
| JP | 2018042042 A | * | 3/2018 | |
| JP | 6394036 B2 | * | 9/2018 | |
| WO | WO-2021124644 A1 | * | 6/2021 | |
| WO | WO-2021241137 A1 | * | 12/2021 | ............. H02M 1/08 |

OTHER PUBLICATIONS

Extended European Search Report issued in corresponding EP Application No. 21826768.0, dated Jun. 12, 2024 (7 pages).
International Search Report with English Translation and Written Opinion in International Application No. PCT/JP2021/004273 dated May 25, 2021.

* cited by examiner

METHOD AND SYSTEM FOR DIAGNOSING ABNORMALITY OF POWER DEVICE DRIVE IN INVERTER DEVICE

TECHNICAL FIELD

The present invention relates to an inverter device used effectively for making a diagnosis of abnormality of power device drive.

BACKGROUND ART

An inverter device (which may hereinafter be simply referred to as an inverter) is a device that converts DC power into AC power. An in-vehicle inverter device drives and controls a motor with AC power into which DC power from a lithium ion battery, etc., is converted, thereby controlling a driving force a vehicle needs. Because AC power that drives the motor is very large, a functional safety procedure is required, by which when a failure occurs, the failure is detected quickly and the motor is stopped safely to reduce the risk of the failure's developing into a serious problem. If a failure cannot be detected or slow detection of a failure results in a delay in safety control of the vehicle, it may lead to a secondary failure or the like, thus posing the risk of causing the vehicle a more serious problem. It is therefore important to detect the failure quickly and stop the vehicle safely.

The in-vehicle inverter device, in general, measures a three-phase output alternating current to the motor and an input DC voltage and controls switching of power devices of three phases making up an upper arm and a lower arm, thereby controlling a required torque according to the rotating speed of the motor to drive the motor. In this motor control, the measured output alternating current shows a current response determined by the size of the inductance load of the motor, and therefore a sharp change in the alternating current does not occur. Meanwhile, because the inverter has a large capacitor incorporated therein, a sharp change in the input DC voltage hardly occurs. Because of these facts, quickly detecting a failure upon its occurrence through measurement of the output AC current and the input DC voltage is difficult. This leaves a possibility that a secondary failure may occur due to overcurrent or overtemperature, which is a problem. To deal with this problem, a method of detecting various abnormalities of each of the power devices of three phases making up the upper arm and the lower arm, which are output units of the inverter, has been disclosed.

For example, PTL 1 discloses a technique related to "an inverter device and a method of detecting an abnormality of an inverter device, the inverter device and the method being related to an inverter including a large-capacity power semiconductor module and, particularly, being configured to detect occurrence of an abnormality, such as wire-breaking, contact failure, or missing connection, in at least one of gate wiring lines (a gate line or an emitter line) before the start of the inverter.

CITATION LIST

Patent Literature

PTL 1: JP 2013-247734 A

SUMMARY OF INVENTION

Technical Problem

The technique disclosed in PTL 1 is a technique according to which "in a diagnosis period before the start of an inverter, a voltage value between a gate terminal and an emitter terminal of each power semiconductor element in an arm in a state of a drive signal being off or a rise time of a gate driver output voltage that results when a pulse driving signal for abnormality diagnosis is applied from a gate driver to each driving gate terminal is detected for each arm as data for abnormality diagnosis, and the detected data for abnormality diagnosis is compared with a given value to detect an abnormality of a gate wiring line before the start of the inverter." In short, the technique disclosed in PTL 1 is a technique of making a diagnosis on wire-breaking of a power device before the start of an inverter device. However, the inverter device gets into various failure modes, which include not only wire-breaking but also short circuit. It is necessary to detect these various failures and stop the inverter device safely.

An object of the present invention is to provide an inverter device that quickly detects an abnormality of a power device, which is an output unit of the inverter device, and of gate drive to be able to safely control and stop the inverter device.

Solution to Problem

In order to solve the above problem, an inverter device according to the present invention includes a power device, a gate drive unit that drives the power device, and a microcontroller that controls the gate drive unit, and further includes a gate voltage detection unit that detects a gate voltage of the power device with respect to a given threshold voltage. The given threshold voltage is a voltage lower than a threshold voltage of the power device. The microcontroller compares a gate drive signal outputted from the microcontroller with a gate voltage detection signal outputted from the gate voltage detection unit to form a signal loop composed of a drive path for the gate voltage and a detection path for the gate voltage, and makes a diagnosis on whether the gate voltage of the power device has an abnormality. An inverter device according to the present invention includes a power device, a gate drive unit that drives the power device, and a microcontroller that controls the gate drive unit, and further includes a drain voltage detection unit that detects a drain voltage of the power device with respect to a given threshold voltage referenced to a source voltage. The microcontroller compares a gate drive signal outputted from the microcontroller with a drain voltage detection signal from the drain voltage detection unit to form a signal loop composed of a drive path for a gate voltage and a detection path for the gate voltage, and when a forward current flows through the power device, makes a diagnosis on whether the power device has an abnormality.

Advantageous Effects of Invention

According to the present invention, an abnormality of the power device and gate drive can be detected quickly and the inverter device can be stopped safely.

Problems, configurations, and effects that are not described above will be made clear by the following description of embodiments.

DESCRIPTION OF EMBODIMENTS

Figure 1:
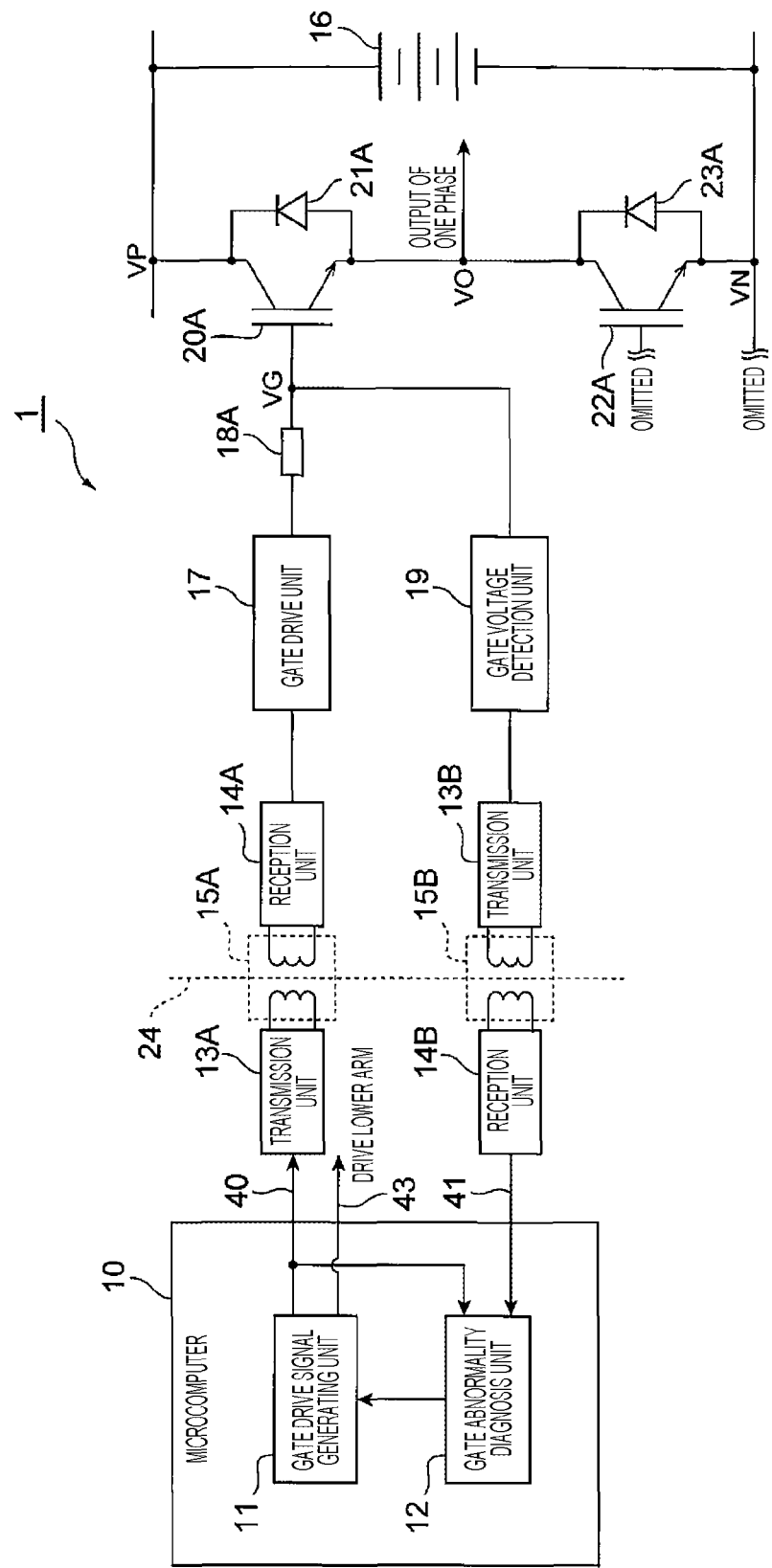
FIG. 1 is a schematic configuration diagram of an inverter device according to a first embodiment.

Embodiments of the present invention will hereinafter be described with reference to the drawings. In the drawings, the same constituent elements are denoted by the same reference signs, and detailed description of overlapping parts is omitted.

Figure 4:
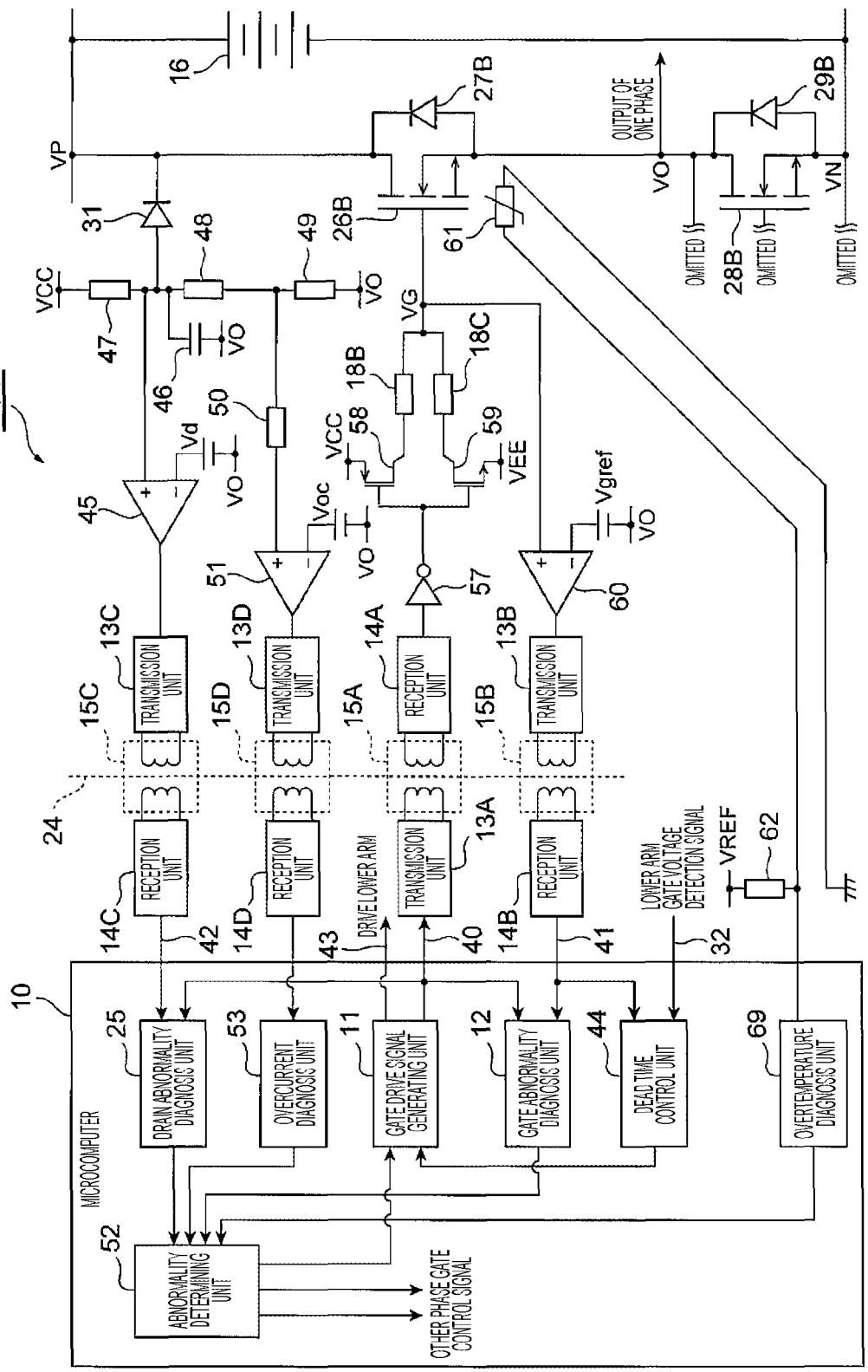
FIG. 4 is a schematic configuration diagram of an inverter device according to fourth and fifth embodiments.
Figure 5:
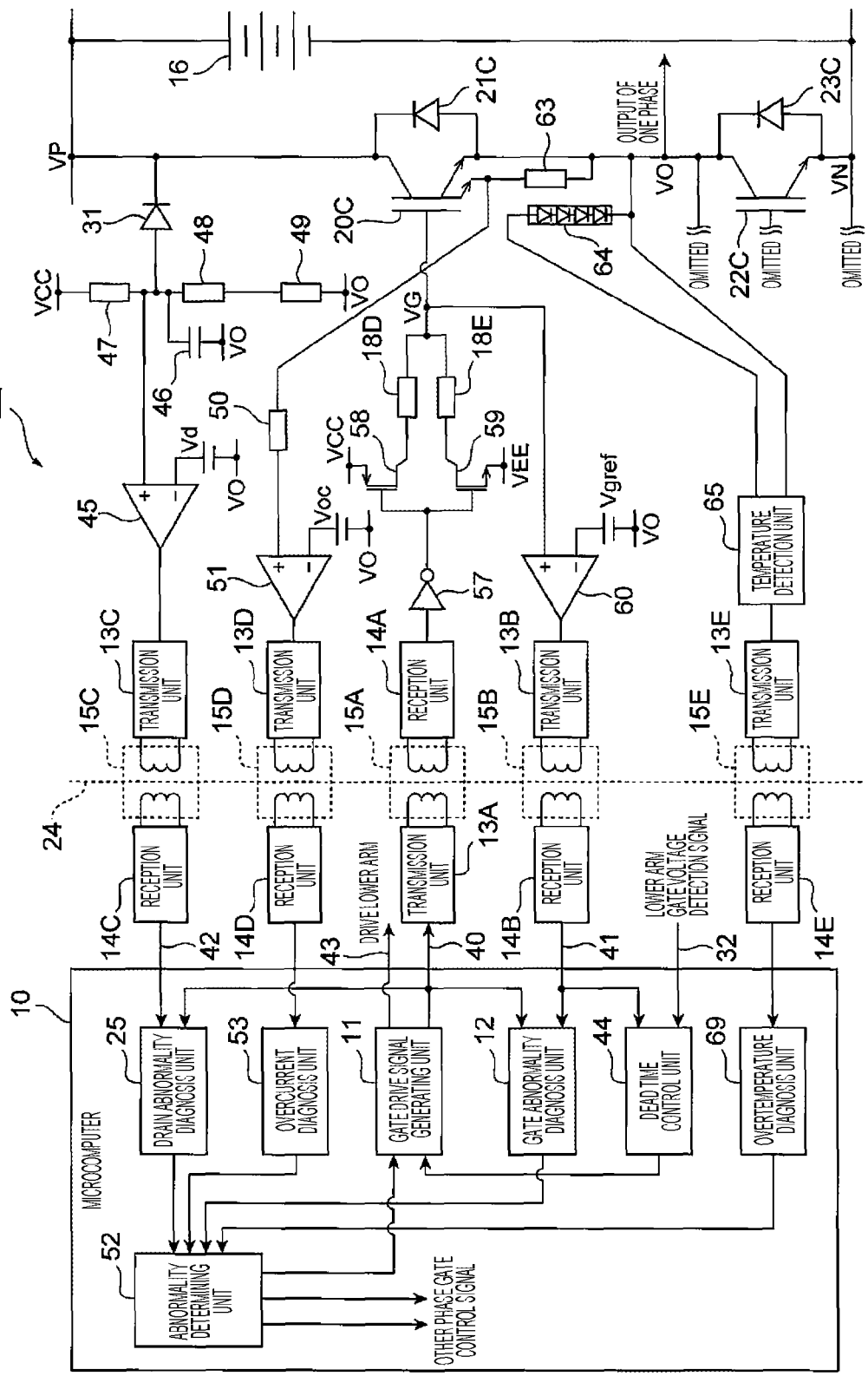
FIG. 5 is a schematic configuration diagram of an inverter device according to a sixth embodiment.
Figure 6:
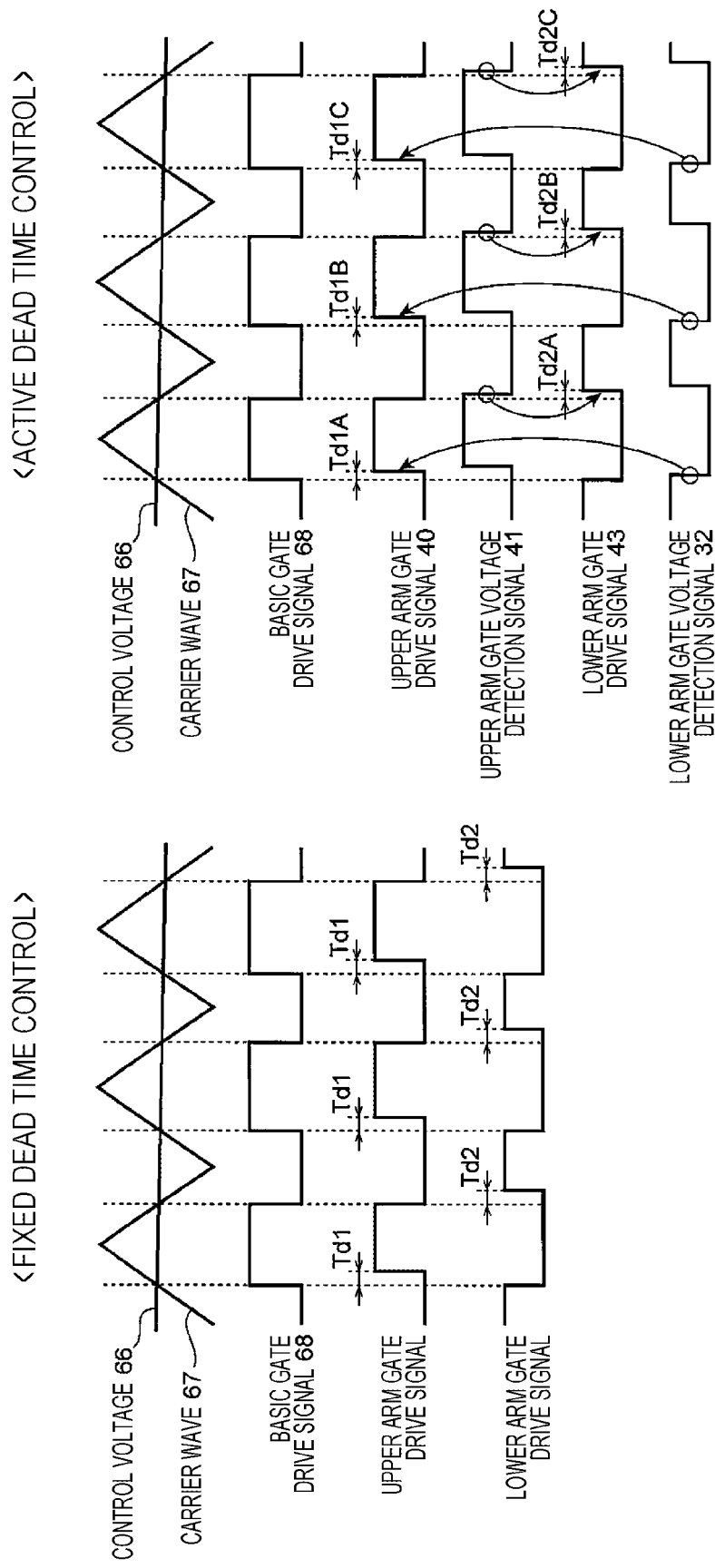
FIG. 6 shows time charts of dead time control according to the third to sixth embodiments.
Figure 7:
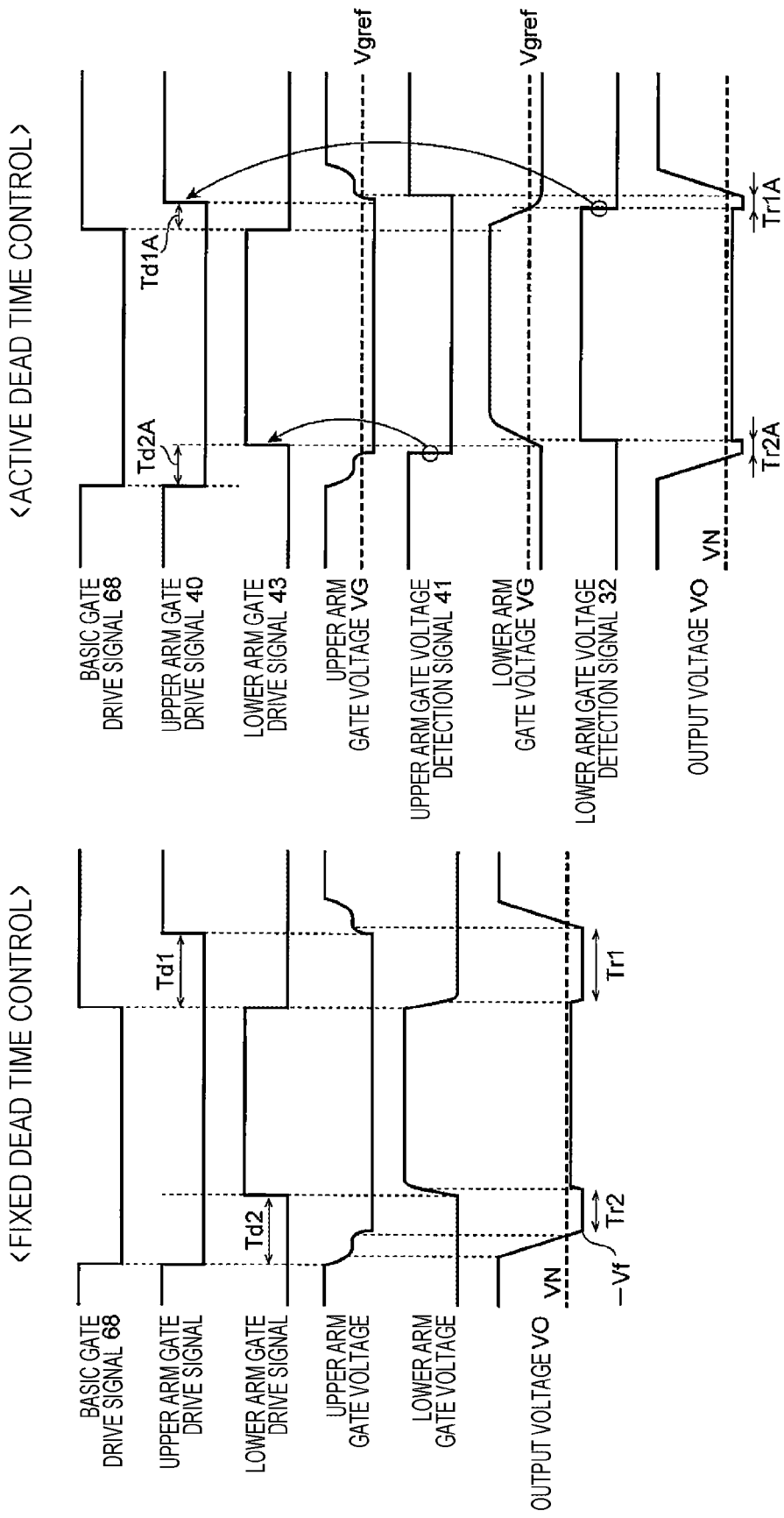
FIG. 7 shows detailed time charts of the dead time control according to the third to sixth embodiments.
Figure 8:
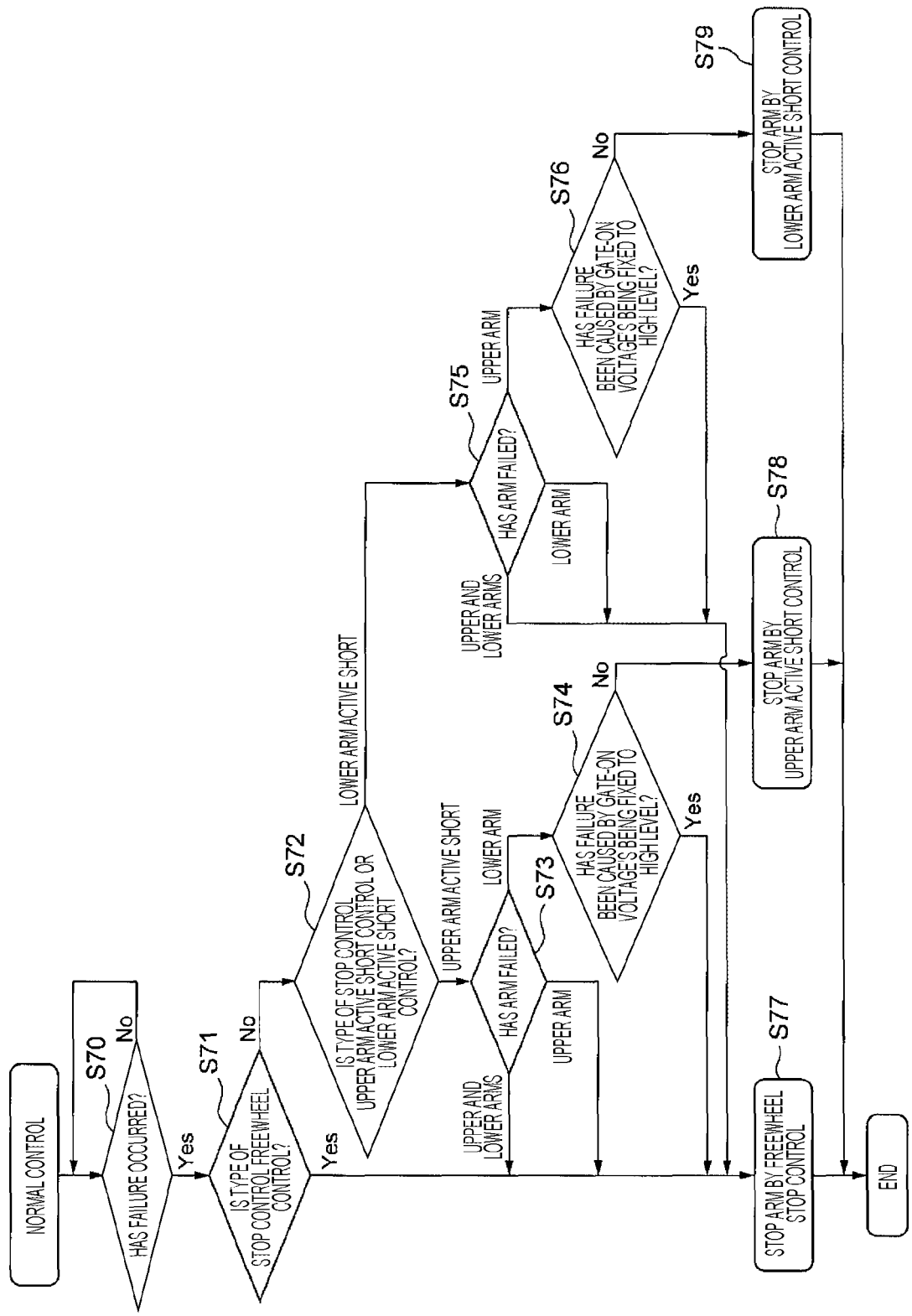
FIG. 8 is a control flowchart showing a control flow carried out at the time of a failure diagnosis according to the first to sixth embodiments.
Figure 9:
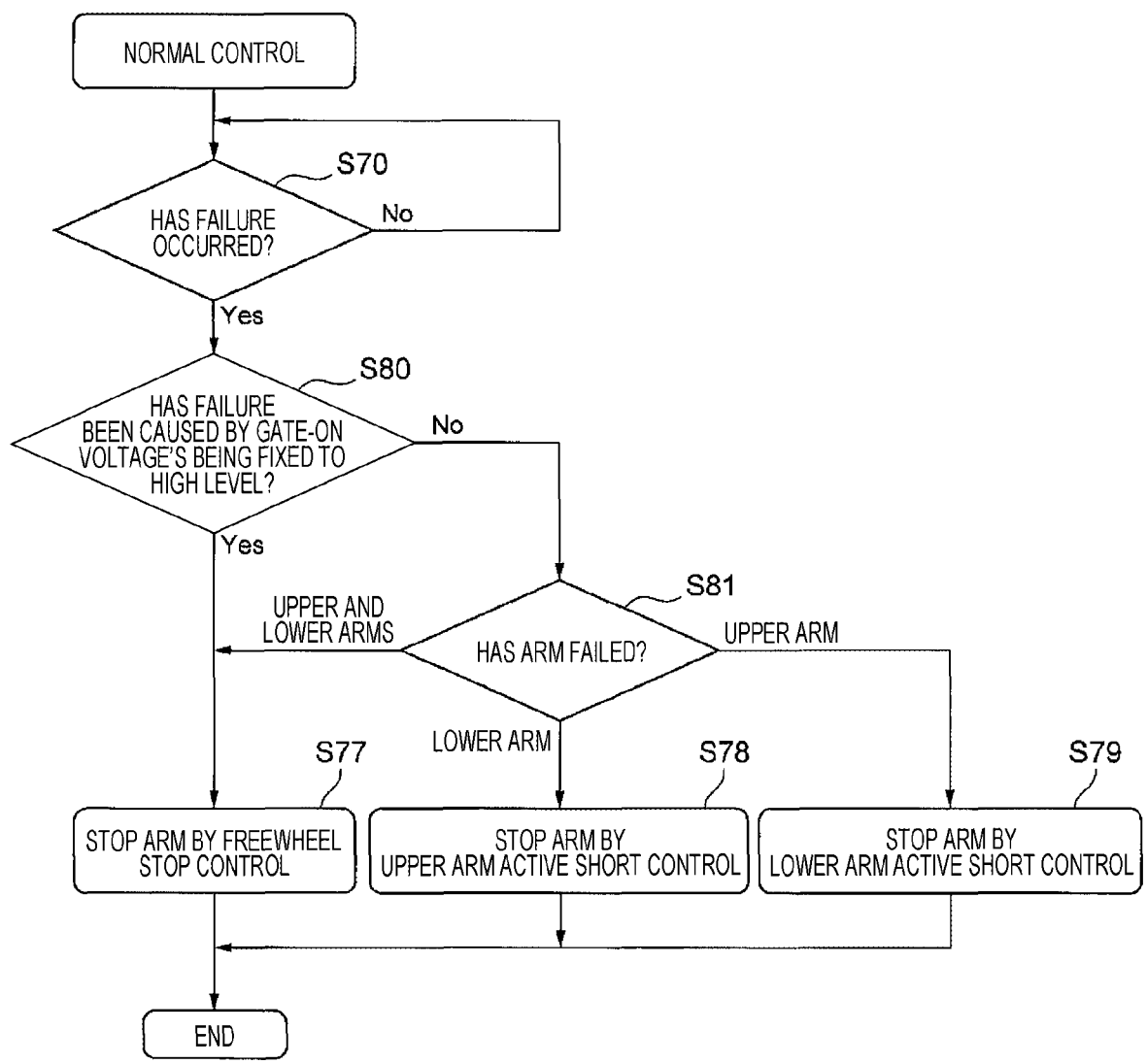
FIG. 9 is a control flowchart showing a control flow carried out at the time of a failure diagnosis according to the first to sixth embodiments.

In addition, the configuration diagrams of FIGS. 1 to 5, the time charts of FIGS. 6 and 7, and the flowcharts of FIGS. 8 and 9 are examples of embodiments according to the present invention, and are not intended for putting any limitation on the claims. Terminals of a power device are uniformly referred to as a gate terminal, a drain terminal, and a source terminal. In the case of an IGBT, however, the drain terminal can be read as the collector terminal and the source terminal as the emitter terminal. The power device is described as an IGBT or SiC. However, the embodiments apply to all types of power devices that control their switching on/off by a gate voltage, such as IGBT, SiC, Si-MOSFET, and GaN. An isolator element is described as a transformer. However, the embodiments apply to all types of isolator elements, which include isolator elements using photocouplers or capacitors.

First Embodiment

An inverter device 1 according to a first embodiment of the present invention will be described with reference to FIG. The inverter device 1 shown in FIG. 1 includes a high-voltage battery 16 (lithium ion battery or the like), an upper arm power device 20A connected to a positive terminal VP of the high-voltage battery 16 and to an output terminal (output voltage) VO, an upper arm freewheeling diode 21A, a lower arm power device 22A connected to the output voltage VO and to a negative terminal VN of the high-voltage battery 16, and a lower arm freewheeling diode 23A. The inverter device 1 alternately switches these upper and lower arms on and off to switch an output voltage and drive a motor. The upper arm power device 20A and the lower arm power device 22A of this embodiment are described as IGBTs. In general, an in-vehicle inverter device drives a three-phase motor including drive circuits of a U phase, a V phase, and a W phase. However, this embodiment will be described by paying attention to upper and lower arms of one phase. The other upper and lower arms of two phases are controlled by the microcontroller 10 to output alternating currents, respectively. In this embodiment, these upper and lower arms are identical in configuration with the upper and lower arms of one phase, and are therefore not described. The upper arm power device 20A and the lower arm power device 22A are under PWM (Pulse Width Modulation) control by the microcontroller 10. Because the upper and lower arms are identical in configuration in this embodiment, the upper arm power device 20A will be described as description of the lower arm power device 22A will be omitted.

The inverter device 1 shown in FIG. 1 includes the microcontroller (microcomputer) 10, and a gate drive signal generating unit 11 of the microcontroller 10 generates a gate drive signal 40 to power devices of three sets (phases) of upper and lower arms, i.e., six arms for driving the motor. The generated gate drive signal 40 to the upper arm is transmitted through an insulation section 24 (inter-insulation communication) between a low-voltage area including the microcontroller 10 and a high-voltage area including the power devices (20 A, 22 A), by an isolator transmission unit 13A, an isolator element 15A, and an isolator reception unit 14A, and is transmitted to a gate drive unit 17, which applies a gate voltage VG for switching the upper arm power device 20A on and off. A gate resistance 18A is a gate resistance for adjusting a slew rate of the output voltage VO when the power device switches on and off or adjusting a surge voltage when the power device switches off.

The inverter device 1 of this embodiment includes a gate voltage detection unit 19 that determines (detects) the gate voltage VG with respect to a given threshold voltage lower than a threshold voltage of the power device, and transmits a detection result (output signal) from the gate voltage detection unit 19 to the microcontroller 10, as a gate voltage detection signal 41 via an isolator communication section composed of an isolator transmission unit 13B, an isolator element 15B, and an isolator reception unit 14B. In the microcontroller 10, a gate abnormality diagnosis unit 12 compares the gate drive signal 40 (outputted from the gate drive signal generating unit 11) with the gate voltage detection signal 41 (outputted from the gate voltage detection unit 19), and when finding that the gate voltage detection signal 41 is delayed relative to the gate drive signal 40 by a desired delay time, determines the gate voltage to be normal and continues output of the gate drive signal 40. When a rise and a fall of the gate voltage detection signal 41 are delayed relative to a rise and a fall of the gate drive signal 40 by an abnormal delay time exceeding the desired delay time, however, the gate abnormality diagnosis unit 12 diagnoses the gate voltage as abnormal. When the gate voltage detection signal 41 is fixed to a high level or a low level for a certain period of time, the gate abnormality diagnosis unit 12 also diagnoses the gate voltage as abnormal. When the gate abnormality diagnosis unit 12 diagnoses the gate voltage as abnormal, the gate abnormality diagnosis unit 12 transmits the diagnosis result to the gate drive signal generating unit 11, which allows control by which the gate drive signal 40 to the upper arm is stopped and a gate drive signal 43 to the lower arm is stopped as well.

In this manner, according to this embodiment, the inverter device 1 includes the gate voltage detection unit 19 that determines (detects) the gate voltage VG with respect to the given threshold voltage lower than the threshold voltage of the power device, and the gate abnormality diagnosis unit 12 of the microcontroller 10 compares the gate drive signal 40 (outputted from the gate drive signal generating unit 11)

with the gate voltage detection signal 41 (outputted from the gate voltage detection unit 19) to make a diagnosis on a normal operation. Thus, a signal loop is formed of a drive path for the gate voltage VG (a path leading from the microcontroller 10 to a gate voltage VG terminal of the power device via the gate drive unit 17) and a detection path for the gate voltage VG (a path leading from the gate voltage VG terminal of the power device to the microcontroller 10 via the gate voltage detection unit 19), and the gate abnormality diagnosis unit 12 of the microcontroller 10 makes a diagnosis on whether the gate voltage VG has an abnormality. This allows an accurate diagnosis on normal operation of the gate voltage VG. For example, even when a failure, such as wire-breaking or short circuit, occurs in the signal path leading from the microcontroller 10 to the gate voltage VG terminal or a failure, such as wire-breaking or short circuit, occurs in the detection path leading from the gate voltage VG terminal to the microcontroller 10, the gate abnormality diagnosis unit 12 of the microcontroller 10 can certainly diagnose the failure (abnormality) within one PWM cycle.

Through this quick abnormality diagnosis, the gate drive signal 40 to the upper arm and the gate drive signal 43 to the lower arm can be stopped quickly. At the occurrence of an abnormality, therefore, the inverter device 1 can be controlled and stopped safely in a swift manner.

Second Embodiment

An inverter device 2 according to a second embodiment of the present invention will be described with reference to FIG. 2. The inverter device 2 shown in FIG. 2 includes a drain voltage detection unit 30 and a drain abnormality diagnosis unit 25, in addition to constituent elements of the first embodiment shown in FIG. 1. A cathode of a rectifier diode 31 is connected to a drain terminal of an upper arm power device 20B, and an anode of the rectifier diode 31 is connected to the drain voltage detection unit 30. In this configuration, when the upper arm power device 20B switches on, the drain voltage detection unit 30 detects a drain voltage of the upper arm power device 20B having dropped relative to a source voltage (output voltage VO). In this case, the drain voltage detection unit 30 detects the drain voltage of the upper arm power device 20B with respect to the source voltage (output voltage VO). The drain voltage detection unit 30, however, may detect the drain voltage with respect to a given threshold voltage referenced to the source voltage (output voltage VO). A signal detected by the drain voltage detection unit 30 is transmitted to the microcontroller 10, as a drain voltage detection signal 42 via an isolator transmission unit 13C, an isolator element 15C, and an isolator reception unit 14C. The drain abnormality diagnosis unit 25 of the microcontroller 10 compares the gate drive signal 40 (outputted from the gate drive signal generating unit 11) with the drain voltage detection signal 42 (outputted from the drain voltage detection unit 30), thereby making a diagnosis on normal operation of the drain voltage of the upper arm power device 20B. Control to be carried out when the drain abnormality diagnosis unit 25 diagnoses the drain voltage as abnormal is the same as control to be carried out in the first embodiment when the gate voltage is diagnosed as abnormal.

The inverter device 2 outputs an alternating current to the motor, and therefore an alternating current outputted from the output terminal VO changes its flow direction between a forward direction and a reverse direction. Now a current flow direction from the output terminal VO to the motor is defined as the forward direction and the same from the motor to the output terminal VO is defined as the reverse direction. In a case of the current flowing in the forward direction, the upper arm power device 20B carries a current flow when the upper arm power device 20B is on but a lower arm freewheeling diode 23B carries a current flow when the upper arm power device 20B is off. Conversely, in a case of the current flowing in the reverse direction, a lower arm power device 22B carries a current flow when the lower arm power device 22B is on but an upper arm freewheeling diode 21B or the upper arm power device 20B carries a current flow when the lower arm power device 22B is off. In other words, in the case of the current flowing in the reverse direction, the current flows through the upper arm freewheeling diode 21B even when the upper arm power device 20B is on. As a result, the drain voltage of the upper arm power device 20B drops relative to the source voltage.

It follows from the above that the drain abnormality diagnosis unit 25 of the microcontroller 10 is able to make a proper diagnosis of the drain voltage when a forward current flows through the power device. In general, the three-phase motor driven by the in-vehicle inverter device senses an alternating current of each phase and uses the alternating current for calculation by the microcontroller, thus being able to determine whether the current flows in the forward direction or the reverse direction. As a result, when the current flows in the forward direction, whether on/off operations of the upper arm power device 20B is normal can be determined. When the current flows in the reverse direction, on the other hand, whether on/off operations of the lower arm power device 22B making up a reverse arm is normal can be determined.

As described above, the inverter device 2 of this embodiment includes the drain voltage detection unit 30 that, under a condition of a forward current's flowing the upper arm power device 20B serving as an output unit, determines (detects) the drain voltage of the upper arm power device 20B with respect to the given threshold voltage referenced to the source voltage. The drain abnormality diagnosis unit 25 of the microcontroller 10 compares the gate drive signal 40 (outputted from the gate drive signal generating unit 11) with the drain voltage detection signal 42 (outputted from the drain voltage detection unit 30) to make a diagnosis on normal operation. Thus, a signal loop is formed of a drive path for the gate voltage VG (a path leading from the microcontroller 10 to the upper arm power device 20B via the gate drive unit 17) and a detection path for the drain voltage (a path leading from the upper arm power device 20B to the microcontroller 10 via the drain voltage detection unit 30), and the drain abnormality diagnosis unit 25 of the microcontroller 10 makes a diagnosis on whether the upper arm power device 20B has an abnormality. This allows an accurate diagnosis on normal operation (on/off operations) of the upper arm power device 20B. For example, even when a failure, such as wire-breaking or short circuit, occurs in the signal path leading from the microcontroller 10 to the gate voltage VG terminal or a failure, such as wire-breaking or short circuit, occurs at the upper arm power device 20B, or a failure, such as wire-breaking or short circuit, occurs in the detection path leading from the drain voltage terminal of the upper arm power device 20B to the microcontroller 10, the drain abnormality diagnosis unit 25 of the microcontroller 10 can certainly diagnose the failure (abnormality) within one PWM cycle. Under a condition that a reverse current flows as an output current, a diagnosis on normal operation of the lower arm power device 22B can certainly be carried out in the same manner.

Through this quick abnormality diagnosis, the gate drive signal 40 to the upper arm and the gate drive signal 43 to the lower arm can be stopped quickly. At the occurrence of an abnormality, therefore, the inverter device 2 can be controlled and stopped safely in a swift manner.

Figure 2:
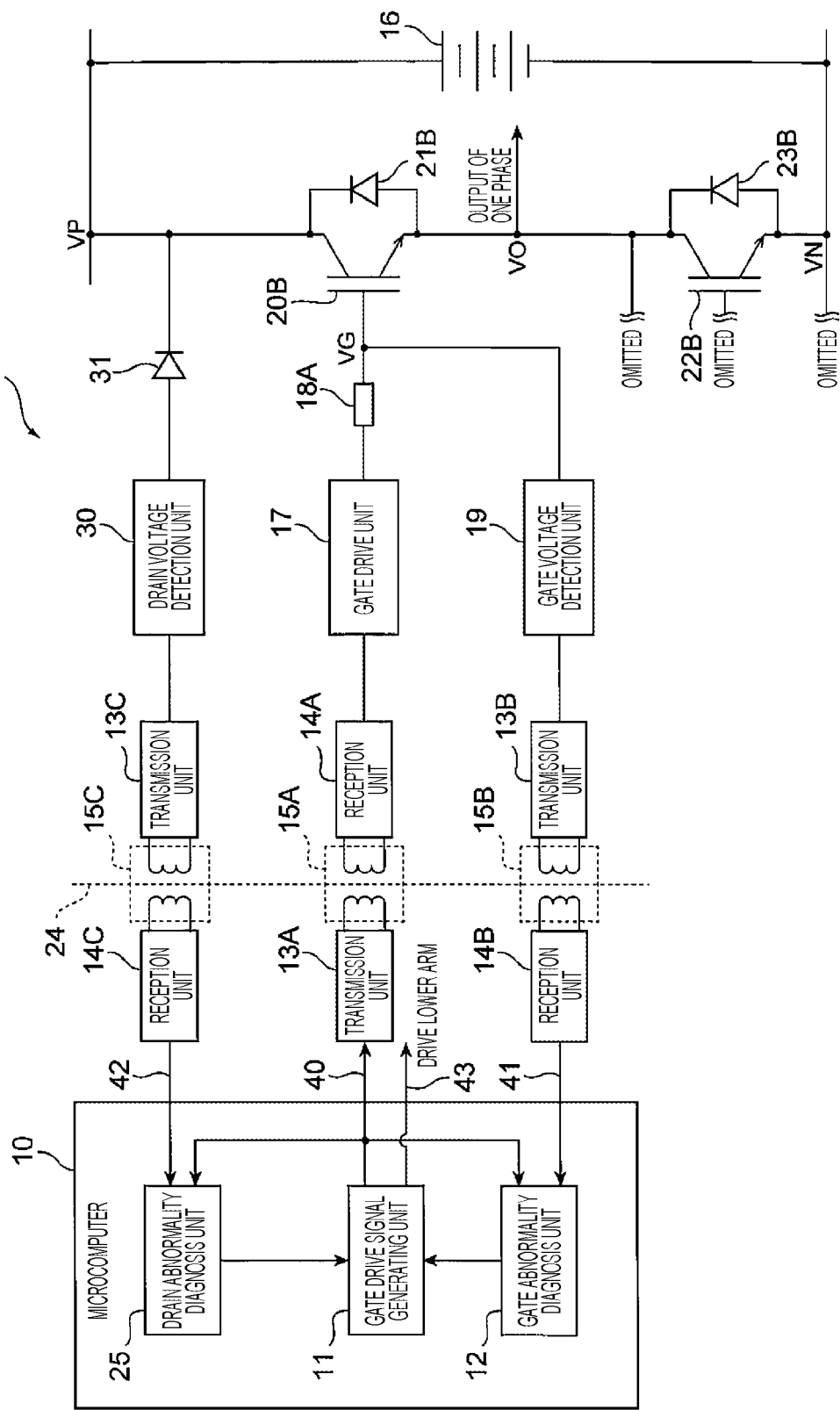
FIG. 2 is a schematic configuration diagram of an inverter device according to a second embodiment.

As shown in FIG. 2, the inverter device 2 of the second embodiment includes the gate voltage detection unit 19 that detects the gate voltage VG of the power device with respect to the given threshold voltage, and the drain voltage detection unit 30 that detects the drain voltage with respect to the given threshold voltage. The microcontroller 10 compares the gate drive signal 40 with the gate voltage detection signal 41 to make a diagnosis, and compares the gate drive signal 40 and the drain voltage detection signal 42 to make a diagnosis. This allows a quick diagnosis on normal drive and detection of the gate voltage VG and normal drive and detection of the power device. In other words, by constantly monitoring the gate voltage and the drain voltage for driving the power device, (presence or absence of) an abnormality can be detected quickly, which allows the inverter device to be controlled and stopped safely.

Third Embodiment

Figure 3:
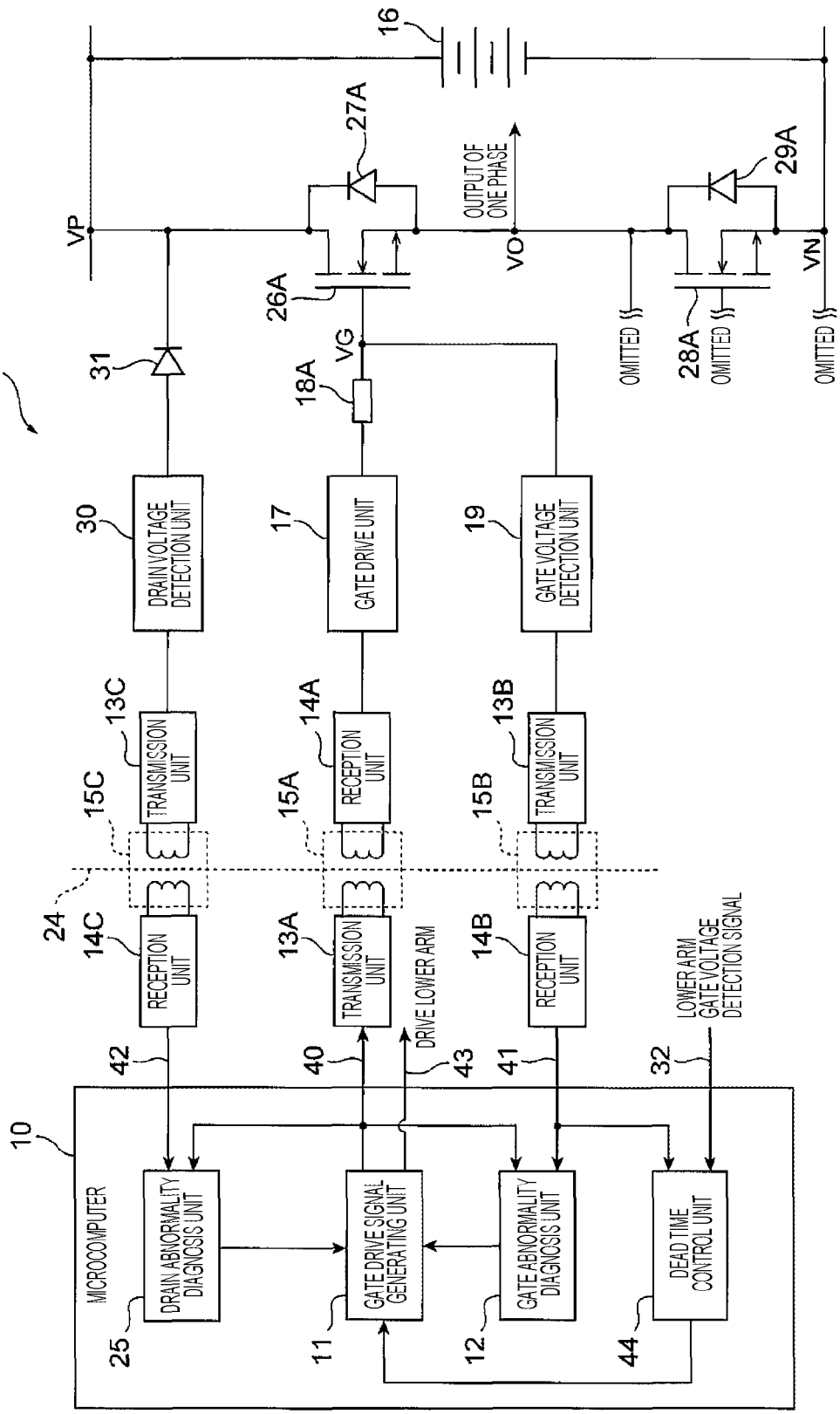
FIG. 3 is a schematic configuration diagram of an inverter device according to a third embodiment.

An inverter device 3 according to a third embodiment of the present invention will be described with reference to a configuration diagram of FIG. 3 and time charts of FIGS. 6 and 7. The inverter device 3 shown in FIG. 3 includes a dead time control unit 44 added to the microcontroller 10, in addition to constituent elements of the second embodiment shown in FIG. 2, and a gate voltage detection signal 32 from the lower arm and the gate voltage detection signal 41 from the upper arm are inputted to this dead time control unit 44. In addition, the inverter device 3 includes an upper arm power device 26A and a lower arm power device 28A, which are SiC power devices.

As shown in a time chart on the left side in FIG. 6, to control the average voltage of the output voltage VO, the inverter device compares a control voltage 66 for the target output voltage VO with a carrier wave 67 with a constant cycle to generate a basic gate drive signal 68 by PWM. To prevent the upper arm and the lower arm from switching on simultaneously, dead times Td1 and Td2 at which both the upper arm and the lower arm switch off need to be controlled. In general, the dead times Td1 and Td2 are set as fixed times. For this reason, as shown in the time chart on the left side in FIG. 6, the fixed dead times Td1 and Td2 are subtracted from the basic gate drive signal 68 to generate a gate drive signal to the upper arm and a gate drive signal to the lower arm, and each of the arms is driven by the generated signal. These fixed dead times need to be set as times during which the upper arm and the lower arm do not switch on simultaneously, by taking account of a worst case resulting from various variation elements, such as a maximum or a minimum of an output current, variations in thresholds of the power device, variations in the capability of the gate drive unit, and variations in a gate drive adjustment resistance.

Meanwhile, during the periods of dead times, respective power devices of the upper arm and the lower arm are simultaneously off, and therefore an output current flows through the freewheeling diode of the upper arm or of the lower arm (27A or 29A). Consequently, during the periods of dead times, heat loss of the freewheeling diode (27A, 29A) increases.

In this embodiment, as shown in a time chart on the right side in FIG. 6, when the gate voltage detection signal 32 from the lower arm falls at the dead time control unit 44 when the basic gate drive signal 68 is at a Hi level, the gate drive signal 40 to the upper arm is raised. Similarly, when the gate voltage detection signal 41 from the upper arm falls at the dead time control unit 44 when the basic gate drive signal 68 is at a Low level, the gate drive signal 43 to the lower arm is raised. In addition, a fall of the gate drive signal 40 to the upper arm and a fall of the gate drive signal 43 to the lower arm are synchronized with a fall of the basic gate drive signal 68 and a rise of the same, respectively. Through this process, dead times Td1A, Td1B, Td1C, Td2A, Td2B, and Td2C, at which both the upper arm and the lower arm switch off, are controlled actively in a variable pattern (not in a fixed pattern).

As described above, in the this embodiment, by control of raising the gate drive signal to the arm in response to the fall of the gate voltage detection signal from the reverse arm, that is, control of generating the gate drive signal to the power device from the gate voltage detection signal from the counter power device, that is, control of generating the gate drive signal to the reverse arm (counter power device) from the gate voltage detection signal from the arm (power device), the lower arm's being off as a result of a sufficient drop in its gate voltage is detected and the upper arm is switched on. This prevents simultaneous switching on of the upper arm and the lower arm and at the same time, allows actively varying the dead times under a condition of various variations, such as output current conditions, variations in thresholds of the power device, variations in the capability of the gate drive unit, and variations in the gate drive adjustment resistance, thus allowing a reduction in the dead times. By reducing the dead times, heat loss that arises at the freewheeling diode during the periods of dead times can be reduced.

In addition, even when the gate voltage of the reverse arm remains fixed to the high level to cause a failure, the gate voltage detection signal from the reverse arm does not fall to prevent the gate drive signal to the arm from going high. This avoids a case where the upper and lower arms switch on simultaneously due to the failure of the reverse arm.

A power device that exerts the effect of reducing the heat loss of the freewheeling diode through the shortened dead times is a power device allowing current to flow in both forward and the reverse directions, such as an SiC device. When the power device provided as an SiC device is combined with the freewheeling diode provided as an SiC body diode, the body diode shows a large forward voltage and suffers greater loss, in which case the above effect offers a greater advantage.

FIG. 7 shows more detailed time charts, which result when a forward current flows through the upper arm. As shown in a time chart on the right in FIG. 7, by detecting the gate voltage of the upper arm with respect to a comparison voltage Vgref of the gate voltage detection unit 19, the upper arm power device 26A being off is detected, and the gate drive signal 43 to the lower arm is raised. Similarly, by detecting the gate voltage of the lower arm with respect to the comparison voltage Vgref, the lower arm power device 28A being off is detected, and the gate drive signal 40 to the upper arm is raised. As a result, time spans during which current flows through the freewheeling diode in the periods of dead times are reduced.

The dead times reduced by this control can be further reduced by shortening a time to take to transmit a signal from the gate voltage detection unit 19 to the microcontroller 10. In general, integrating discrete semiconductors into a single semiconductor reduces a device size, thus reducing the number of parasitic capacitances or the like, which allows faster signal transmission. In this embodiment, the gate voltage detection unit 19 and the isolator communication section composed of the isolator transmission unit 13B, the isolator element 15B, and the isolator reception unit 14B are integrated (incorporated) into a gate drive IC. In this configuration, a state of the gate voltage is transmitted to the microcontroller 10 at a high speed, which can enhance the effect of reducing the dead times.

Fourth Embodiment

An inverter device 4 according to a fourth embodiment of the present invention will be described with reference to a configuration diagram of FIG. 4 and a control flowchart of the inverter device of FIG. 8 showing a control flow at the time of a failure diagnosis. The inverter device 4 shown in FIG. 4 includes, in addition to constituent elements of the third embodiment shown in FIG. 3, an overcurrent diagnosis unit 53 and an overtemperature diagnosis unit 69 of the microcontroller 10 and further includes an abnormality determining unit 52 that determines the content of an abnormality diagnosis of the arm, from diagnosis results from the overcurrent diagnosis unit 53, the overtemperature diagnosis unit 69, the drain abnormality diagnosis unit 25, and the gate abnormality diagnosis unit 12. The abnormality determining unit 52 of the microcontroller 10 controls and stops the inverter device according to the content of abnormality of the arm in accordance with the control flowchart of the inverter device of FIG. 8 showing a control flow at the time of a failure diagnosis.

In general, the in-vehicle inverter device carries out control for stopping output (power device) at the time of a failure diagnosis, as the following three types of control: free wheel control by which three sets (phases) of upper and lower arms, i.e., six arms are all switched off and reflux currents of three phases are refluxed to the high-voltage battery via freewheel diodes; upper arm active short control by which three upper arms of three phases are all switched on as three lower arms of three phases are all switched off to cause the upper arms to reflux the current; and lower arm active short control by which three lower arms of three phases are all switched on as three upper arms of three phases are all switched off to cause the lower arms to reflux the current. By the upper and lower active short control, output voltages of three phases are refluxed to the positive terminal VP or the negative terminal VN of the high-voltage battery through short circuits to absorb regenerative energy from the motor. This creates a strong torque acting in a stop direction, allowing quick stoppage of the motor. By the free wheel control, on the other hand, a regenerative current from the motor is refluxed by the freewheeling diode of the upper arm or the lower arm, and nothing more. Because the output voltage is not fixed, a torque created by the control for stopping the motor is weak, thus taking much time to stop the motor. It is a safer approach for the vehicle that when a failure occurs, the motor is stopped quickly by three-phase active short control. However, in a case where active short control is carried out based on an erroneous determination on failure details, an unexpected secondary failure or the like may occur. It is therefore necessary to correctly determine the failure details and select the free wheel control or the upper and lower active short control for stopping the motor.

The control flow of FIG. 8 to carry out at the time of a failure diagnosis is a control flow the inverter device carries out at the time of a failure diagnosis in a case where the type of stop control is determined in advance. When the abnormality determining unit 52 determines that any kind of failure has occurred, based on diagnosis results from the gate abnormality diagnosis unit 12, the drain abnormality diagnosis unit 25, the overcurrent diagnosis unit 53, and the overtemperature diagnosis unit 69, ""Yes" results at a failure occurrence determination step (S70) and therefore stop control is selected.

At a stop control determination step (S71), whether preset stop control is the free wheel is determined, and when a determination result is "Yes", the free wheel stop control is carried out (S77). When the determination result is "No", the process flow proceeds to a stop control determination step (S72), at which whether the stop control is the upper arm active short control or the lower arm active short control is determined. Then, at a faulty arm determination step (S73, S75), when the upper and lower arms are found faulty, the process flow proceeds to a free wheel stop control step (S77). Likewise, when a target arm to be subjected to the active short control is found faulty at the faulty arm determination step (S73, S75), the process flow proceeds to the free wheel stop control step (S77). Even when the target arm is not found faulty at the faulty arm determination step (S73, S75), if the reverse arm to the target arm to be subjected to the active short control has a gate-on voltage fixed to the high level, "Yes" results at a gate-on voltage determination step (S74, S76), in which case the process flow proceeds to the free wheel stop control step (S77). When a failure caused by the gate-on voltage fixed to the high level exists, switching on the reverse arm results in simultaneous switching on of both arms, raising a possibility that a large current causes a secondary failure. For this reason, in this case, both the upper and lower arms are switched off by the free wheel control. When the target arm to be subjected to the active short control is not found faulty at the faulty arm determination step (S73, S75) and the gate-on voltage to the reverse arm to the target arm to be subjected to the active short control is found not fixed to the high level at the gate-on voltage determination step (S74, S76), the process flow proceeds to an upper arm active short step (S78) and a lower arm active short step (S79), at which selected stop controls are carried out, respectively.

Specifically, according to an abnormality of the arm that the gate abnormality diagnosis unit 12 detects from the gate voltage detection signal 41 described in the first and second embodiments and to an abnormality of the arm that the drain abnormality diagnosis unit 25 detects from the drain voltage detection signal 42, the abnormality determining unit 52 of this embodiment changes stop control of the other arms (the other arms making up three sets (phases) of the upper and lower arms, i.e., six arms).

In this manner, according to this embodiment, not only the abnormality of the arm but also the abnormality of the gate voltage being fixed to the high level are determined for each arm when an abnormality occurs. This prevents a secondary failure and at the same time, allows safe control and stoppage of the inverter device 4.

The inverter device 4 shown in FIG. 4 includes the thermistor 61 for detecting an overtemperature of the upper arm power device 26B, and causes the overtemperature diagnosis unit 69 to make a diagnosis by checking a divided voltage between the resistor 62 set to a reference voltage VREF and the thermistor 61. This method of detecting an overtemperature is an example, and a method using a thermosensitive diode 64 (see FIG. 5) may also be adopted for overtemperature detection.

The drain voltage detection unit that transmits the drain voltage detection signal 42 to the drain abnormality diagnosis unit 25 is configured such that resistances 47 and 48, which are connected to the rectifier diode 31, and a resistance 49 are connected in series between a VCC potential terminal and the VO terminal and that a change in the drain voltage relative to the source voltage is detected with respect to a detection voltage Vd by a comparator 45 to detect an abnormality of the drain voltage. This method of detecting the drain voltage is, however, an example, and a detection method using a different detection circuit may also be adopted. Furthermore, for overcurrent diagnosis by the overcurrent diagnosis unit 53, the configuration of the rectifier diode 31 and the resistances 47, 48, and 49 for drain voltage detection is utilized. In this case, generation of overcurrent at the upper arm power device 26B is detected from the drain voltage's not dropping sufficiently when the upper arm power device 26B is on, through detection of a drain voltage change with respect to a detection voltage Voc by a comparator 51 via a resistance 50.

An example in which the rectifier diode 31, the resistances 47, 48, and 49, and a capacitor 46 are common parts of the drain voltage detection unit has been described. However, the rectifier diode 31, the resistances 47, 48, and 49, and the capacitor 46 may not be the common parts but be separately provided dedicated components.

The gate voltage detection unit that transmits the gate voltage detection signal 41 to the gate abnormality diagnosis unit 12 is configured to detect the gate voltage with respect to the detection voltage Vgref by the comparator 60. This detection voltage Vgref is lower than the threshold voltage of the upper arm power device 26B, and the comparator 60 outputs a low-level signal indicating that the gate voltage VG is lower than the detection voltage Vgref, providing a detection result that the upper arm power device 26B is off.

Source terminals of a PMOS 58 and an NMOS 59 connected via an inverter element 57 to drive the gate voltage are connected to a VCC terminal and a VEE terminal, respectively. The VCC terminal is supplied with a voltage high enough to switch the gate on, while the VEE terminal, to switch the gate off, is supplied with the VO voltage equal to the source voltage of the upper arm power device 26B or a negative voltage lower than the VO voltage.

A gate drive adjusting gate resistance 18B has its resistance value adjusted for controlling an output slew rate or an output surge voltage when the upper arm power device 26B switches on. Likewise, a gate drive adjusting gate resistance 18C has its resistance value adjusted for controlling an output slew rate or an output surge voltage when the upper arm power device 26B switches off.

An example of details of a circuit including the gate drive unit, the gate voltage detection unit, the overcurrent detection unit, the drain voltage detection unit, and the overtemperature detection unit has been described. This example does not put any limitations on the claims.

Fifth Embodiment

An inverter device 5 according to a fifth embodiment of the present invention will be described with reference to the configuration diagram of FIG. 4 and a control flowchart of the inverter device of FIG. 9 showing a control flow carried out at the time of a failure diagnosis. The control flow of FIG. 9 carried out at the time of a failure diagnosis is a stop control flow by which when the type of stop control to be carried out at the occurrence of a failure is not determined in advance, the motor can be stopped in a shortest time according to the details of the failure.

First, when the occurrence of a failure is determined at the failure occurrence determination step (S70), the abnormality determining unit 52 determines, at a gate-on voltage determination step (S80), whether the failure, which has occurred at either the upper arm or the lower arms, is the gate-on voltage's being fixed to the high level. When the failure of the gate-on voltage's being fixed to the high level has occurred at either the upper arm or the lower arms, switching on the reverse arm results in simultaneous switching on of both arms, raising a possibility that a large current causes a secondary failure. For this reason, in this case, both the upper and lower arms are switched off by the free wheel control (S77). When it is determined at the gate-on voltage determination step (S80) that the failure of the gate-on voltage's being fixed to the high level has not occurred, stop control is carried out according to the details of a failure of the arm at a faulty arm determination step (S81). When it is determined at the faulty arm determination step (S81) that both the upper and lower arms have failed, stop control is carried out at the free wheel stop control step (S77). When it is determined at the faulty arm determination step (S81) that the lower arm has failed, stop control is carried out at the upper arm active short control step (S78). Likewise, when it is determined at the faulty arm determination step (S81) that the upper arm has failed, stop control is carried out at the lower arm active short control step (S79).

Specifically, in the same manner as in the fourth embodiment, according to an abnormality of the arm that the gate abnormality diagnosis unit 12 detects from the gate voltage detection signal 41 described in the first and second embodiments and to an abnormality of the arm that the drain abnormality diagnosis unit 25 detects from the drain voltage detection signal 42, the abnormality determining unit 52 of this embodiment changes stop control of the other arms (the other arms making up three sets (phases) of the upper and lower arms, i.e., six arms).

In this manner, according to this embodiment, by making a diagnosis on an abnormality, such as the gate-on voltage's being fixed to the high level, a secondary failure is prevented and at the same time, the inverter device 5 is controlled and stopped safely.

In the control flows of FIGS. 8 and 9, only the three-phase active short control is described as an example of the active short control. However, arms of one or two phases out of arms of three phases may be shorted according to a judgement on the content of an abnormality diagnosis.

Sixth Embodiment

An inverter device 6 according to a sixth embodiment of the present invention will be described with reference to a configuration diagram of FIG. 5 and the control flowcharts of the inverter device of FIGS. 8 and 9 showing control flows carried out at the time of a failure diagnosis. In the inverter device 6 shown in FIG. 5, the upper arm power device and the lower arm power device of the fourth embodiment (or the fifth embodiment) shown in FIG. 4 are replaced with an upper arm power device 20C and a lower arm power device 22C, respectively, which shows an IGBT circuit configuration. In a case where an IGBT is used as the power device, a method of overcurrent detection is adopted, according to which a shunt resistance 63 is connected to the emitter terminal for overcurrent detection, and a current flowing through the shunt resistance 63 and a voltage generated at the shunt resistance 63 are detected with respect to the detection voltage Voc by the comparator 51 via the resistance 50 to detect an overcurrent flowing through the upper arm power device 20C.

In addition, a method of detecting an overtemperature of the upper arm power device 20C is adopted, according to which a temperature detection unit 65 detects a drop in a forward voltage of a thermosensitive diode 64 built in the upper arm power device 20C to detects the overtemperature.

In this manner, methods of overcurrent detection and methods of overtemperature detection vary depending on the type of the power device, but the diagnostic flows shown in FIGS. 8 and 9 of this embodiment can be applied uniformly to various methods of overcurrent detection and overtemperature detection.

It should be noted that the present invention is not limited to the above embodiments but includes various modifications.

For example, the above embodiment has been described in detail for easy understanding of the present invention, and is not necessarily limited to an embodiment including all the constituent elements described above. Some constituent elements of a certain embodiment may be replaced with constituent elements of another embodiment, and a constituent element of another embodiment may be added to a constituent element of a certain embodiment. In addition, some of constituent elements of each embodiment can be deleted therefrom or add to or replaced with constituent elements of another embodiment.

A group of control lines/information lines considered to be necessary for description are illustrated, and all control lines/information lines making up the product are not necessarily illustrated. It is safe to assume that, actually, almost the entire constituent elements are interconnected.

REFERENCE SIGNS LIST 1 inverter device (first embodiment)
2 inverter device (second embodiment)
3 inverter device (third embodiment)
4 inverter device (fourth embodiment)
5 inverter device (fifth embodiment)
6 inverter device (sixth embodiment)
10 microcontroller
11 gate drive signal generating unit
12 gate abnormality diagnosis unit
13A, 13B, 13C, 13D, 13E isolator transmission unit
14A, 14B, 14C, 14D, 14E isolator reception unit
15A, 15B, 15C, 15D, 15E isolator element
16 high-voltage battery
17 gate drive unit
18A, 18B, 18C, 18D, 18E gate drive adjusting gate resistance
19 gate voltage detection unit
20A, 20B, 20C upper arm power device
21A, 21B, 21C upper arm freewheeling diode
22A, 22B, 22C lower arm power device
23A, 23B, 23C lower arm freewheeling diode
24 insulation section
25 drain abnormality diagnostic unit
26A, 26B upper arm power device
27A, 27B upper arm freewheeling diode
28A, 28B lower arm power device
29A, 29B lower arm freewheeling diode
30 drain voltage detection unit
31 rectifier diode
32 lower arm gate voltage detection signal
40 upper arm gate drive signal
41 gate voltage detection signal
42 drain voltage detection signal
43 lower arm gate drive signal
44 dead time control unit
45 comparator
46 capacity
47, 48, 49, 50 resistance
51 comparator
52 abnormality determining unit
53 overcurrent diagnosis unit
57 inverter element
58 PMOS
59 NMOS
60 comparator
61 thermistor
62 resistance
63 shunt resistance
64 thermosensitive diode
65 temperature detection unit
66 control voltage
67 carrier wave
68 basic gate drive signal
69 overtemperature diagnosis unit
S70 failure occurrence determination step
S71, S72 stop control determination step
S73, S75, S81 faulty arm determination step
S74, S76, S80 gate-on voltage determination step
S77 freewheel stop control step
S78 upper arm active short stop control step
S79 lower arm active short stop control step

The invention claimed is:

1. An inverter device comprising:
a power device;
a gate drive unit that drives the power device; and
a microcontroller that controls the gate drive unit,
wherein the inverter device further comprises a gate voltage detection unit that detects a gate voltage of the power device with respect to a given threshold voltage,
wherein the given threshold voltage is a voltage lower than a threshold voltage of the power device,
wherein the microcontroller compares a gate drive signal outputted from the microcontroller with a gate voltage detection signal outputted from the gate voltage detection unit to form a signal loop composed of a drive path for the gate voltage and a detection path for the gate voltage, and makes a diagnosis on whether the gate voltage of the power device has an abnormality,
wherein by generating the gate drive signal to a reverse arm, from the gate voltage detection signal, simultaneous switching on of upper and lower arms is prevented, and
wherein by variably controlling a dead time during which both upper and lower arms switch off, the dead time is reduced to reduce loss of the power device during a period of the dead time.

2. The inverter device according to claim 1, wherein the power device is an SiC device.

3. The inverter device according to claim 1, wherein an abnormality of a first arm including the power device is detected from the gate voltage detection signal, and a stop control associated with a second arm is initiated in response to detecting the abnormality.

4. The inverter device according to claim 1, wherein by incorporating the gate voltage detection unit and an isolator communication section in a gate drive IC, the isolator communication section transmitting an output signal from the gate voltage detection unit to the microcontroller, a state of the gate voltage is transmitted to the microcontroller at a high speed.

\* \* \* \* \*